(12) United States Patent
Koyanagi

(10) Patent No.: US 6,191,002 B1
(45) Date of Patent: Feb. 20, 2001

(54) METHOD OF FORMING TRENCH ISOLATION STRUCTURE

(75) Inventor: Kenichi Koyanagi, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/299,020

(22) Filed: Apr. 26, 1999

(30) Foreign Application Priority Data

Apr. 27, 1998 (JP) .................................................. 10-116427

(51) Int. Cl.$^7$ .................................................. H01L 21/76
(52) U.S. Cl. .......................................... 438/431; 438/700
(58) Field of Search .................................. 438/431, 424, 438/430, 691, 692, 700

(56) References Cited

U.S. PATENT DOCUMENTS 6,064,104 * 5/2000 Omid-Zohoor et al. ............. 257/510

FOREIGN PATENT DOCUMENTS

| | | |
|---|---|---|
| 59-189650 | 10/1984 | (JP) . |
| 61-48935 | 3/1986 | (JP) . |
| 62-113443 | 5/1987 | (JP) . |
| 1-223742 | 9/1989 | (JP) . |
| 5-243212 | 9/1993 | (JP) . |
| 7-45605 | 2/1995 | (JP) . |
| 8-8248 | 1/1996 | (JP) . |
| 8-115910 | 5/1996 | (JP) . |
| 9-275135 | 10/1997 | (JP) . |

* cited by examiner

Primary Examiner—David Nelms
Assistant Examiner—Quoc Hoang
(74) Attorney, Agent, or Firm—Young & Thompson

(57) ABSTRACT

A method of forming a trench isolation structure is provided, which prevents generation of defects such as voids, cracks, and depressions of an isolation dielectric formed in an isolation trench without problems such as isolation region expansion, isolation capability degradation, and current leakage increase. In a first step, an isolation trench is formed in a semiconductor substrate to expose a top of the trench from a main surface of the substrate. In a second step, the whole main surface of the substrate is covered with a solution of a silazane perhydride polymer by spin coating, thereby forming a film of the solution covering the whole main surface of the substrate. The trench is entirely filled with the film of the solution. The film of the solution may be formed directly on the main surface of the substrate or formed indirectly over the main surface of the substrate via any intervening film or films. In a third step, the film of the solution covering the main surface of the substrate is converted to an oxide film of silicon covering the main surface of the substrate due to chemical reaction. In a fourth step, the oxide film of silicon covering the main surface of the substrate is selectively removed, thereby leaving a part of the oxide film that is used as an isolation dielectric of a trench isolation structure.

7 Claims, 10 Drawing Sheets

METHOD OF FORMING TRENCH ISOLATION STRUCTURE

BACKGROUND OF THE INVENTION

1. Field of the Invention

The present invention relates to semiconductor device fabrication and more particularly, to a method of forming a trench isolation structure provided in a semiconductor device, which uses spin coating.

2. Description of the Prior Art

The isolation structure of a semiconductor device is, in general, provided to electrically isolate a semiconductor element or elements such as transistors, resistors, and capacitors in an active region from other semiconductor element or elements in a neighboring active region on a same semiconductor substrate.

In recent years, the need to narrow the isolation regions has been becoming stronger with the increasing level of integration of Large-Scale Integrated circuits (LSIs). Thus, with the well-known LOcal Oxidation of Silicon (LOCOS) method where the isolation regions are formed by producing a patterned isolation dielectric on a main surface of a semiconductor substrate of silicon (Si) due to selective oxidation, the isolation regions corresponding to a desired integration level have been being unable to be realized.

To respond to the need, the "trench isolation structures" has been often used, in which neighboring active regions are electrically isolated from one another by an isolation dielectric filled in trenches formed vertically into a semiconductor substrate. The isolation dielectric is typically made of silicon dioxide ($SiO_2$). The trenches are formed in the substrate according to a desired pattern of isolation regions and then, the isolation dielectric is selectively formed so as to fill the trenches.

The trench isolation structure makes it possible to decrease the width of the isolation trenches (i.e., the isolation regions) compared with the isolation regions realized by the conventional LOCOS method. Thus, the trench isolation structure can produce narrower isolation regions corresponding to a recent, high integration level of LSIs.

A conventional method of forming the trench isolation structure is explained below with reference to FIGS. 1A to 1E. In this method, it is needless to say that a lot of isolation trenches are formed in a semiconductor substrate to electrically isolate adjoining active regions from one another. However, only one of the trenches is illustrated to isolate two adjoining ones of the active regions and explained below for the sake of simplification of description.

It is known that Chemical Vapor Deposition (CVD) is effective to form selectively an isolation dielectric of $SiO_2$ to fill fine isolation trenches (e.g., approximately 0.1 μm in width), because CVD produces $SiO_2$ with a good filling property of the trenches, in other words, $SiO_2$ produced by CVD (i.e., CVD-$SiO_2$) has a good trench-filling property. In the conventional method explained below with reference to FIGS. 1A to 1E, high-density plasma CVD, which produces $SiO_2$ with a better trench-filling property, is used.

First, a $SiO_2$ film 105 with a thickness of approximately 20 nm, which serves as a pad oxide, is formed on a main surface of a single-crystal Si substrate 101 by thermal oxidation of the substrate 101. Then, a silicon nitride ($Si_3N_4$) film 106 with a thickness of approximately 200 nm is formed on the $SiO_2$ film 105 by reduced-pressure CVD. The $Si_3N_4$ film 106 is used as a mask for an isolation trench. The state at this stage is shown in FIG. 1A.

Next, after a photoresist film (not shown) is formed on the $Si_3N_4$ film 106 by coating, the photoresist film is patterned by popular exposure and development processes. The patterned photoresist film has a pattern corresponding to the plan shape of a desired isolation trench. In other words, the photoresist film has a window corresponding to the isolation trench to be formed.

Using the patterned photoresist film as a mask, the $Si_3N_4$ film 106 and the $SiO_2$ film 105 are successively patterned by dry etching. Thus, a hole 118 is formed to penetrate through the $Si_3N_4$ and $SiO_2$ films 106 and 105. The hole 118, which has a plan shape corresponding to the window of the photoresist film, is reached the main surface of the substrate 101, as shown in FIG. 1B.

After removing the photoresist film, the main surface of the substrate 101 is selectively and vertically removed by dry etching using the $Si_3N_4$ film 106 as a mask, thereby forming an isolation trench 103 in the substrate 101, as shown in FIG. 1C. The isolation trench 103 has a plan shape corresponding to the window of the photoresist film. For example, the trench 103 has a width of 0.1 μm and a depth of 0.5 μm, resulting in an aspect ratio of 5 (=0.5/0.1).

Subsequently, as shown in FIG. 1D, a $SiO_2$ film 113 is formed on the $Si_3N_4$ film 106 to cover the whole main surface of the substrate 101. The formation process of the $SiO_2$ film 113 is carried out by high-density plasma CVD that produces $SiO_2$ with a better trench-filling property. As a result, the $SiO_2$ film 113 is deposited on the $Si_3N_4$ film 106 and at the same time, it is deposited in the trench 103 and the penetrating hole 118. The state at this stage is shown in FIG. 1D.

The $SiO_2$ film 113 is then polished by Chemical Mechanical Polishing (CMP) until the surface of the underlying $Si_3N_4$ film 106 is exposed. Thus, the $SiO_2$ film 113 is removed while the part of the $SiO_2$ film 113 located under the surface of the $Si_3N_4$ film 106 is left and at the same time, the surface of the $Si_3N_4$ film 106 is planarized.

Finally, the remaining $Si_3N_4$ film 106 and the underlying $SiO_2$ film 105 are successively removed by wet etching. As a result, as shown in FIG. 1E, only the part of the $SiO_2$ film 113 located under the surface of the $Si_3N_4$ film 106 is left. The remaining part of the $SiO_2$ film 113, almost all of which is located in the trench 103 and a top of which is protruded from the main surface of the substrate 101 by a height corresponding to the total thickness of the films 106 and 105, serves as an isolation dielectric. The trench 103 and the remaining $SiO_2$ film 113 constitute a trench isolation structure 102 that isolates electrically two adjoining active regions A101 and A102.

With the conventional method of forming a trench isolation structure shown in FIGS. 1A to 1E, a void (i.e., unfilled part) 114 tends to be formed in the remaining $SiO_2$ film 113 (i.e., the isolation dielectric) during the process of forming the $SiO_2$ film 113 by high-density plasma CVD, as shown in FIG. 1D. This is caused by the fact that the isolation trench 103 is narrow in width and high in aspect ratio. In this case, even if high-density plasma CVD, which produces $SiO_2$ with a better trench-filling property, is used for forming the $SiO_2$ film 113, the whole trench 103 is difficult to be filled with the $SiO_2$ film 113.

If the void 114 exists in the isolation dielectric 113, not only the mechanical strength of the trench isolation structure 102 but also the electrical isolation capability thereof will degrade. Also, there is a possibility that the void 114 appears on the main surface of the substrate 101 after the CMP process of the $SiO_2$ film 113, as shown in FIG. 1E in this case, the exposed void 114 will cause a problem that overlying wiring layers or lines (which will be formed in subsequent processes) are broken or cut.

As an improvement of the above-described conventional method shown in FIGS. 1A to 1E, a method using a different condition of the high-density plasma CVD has been developed. In this method, the void 114 is prevented from being generated due to the enhanced plasma-etching action.

With the improved method using the different CVD condition, although the void 114 can be prevented, the neighborhood of the hole 118 of the films 106 and 105 and the top of the isolation trench 103 tend to be etched by the enhanced plasma-etching action. As a result, as shown in FIG. 2, the sidewalls of the hole 118 and the trench 103 become oblique. The oblique sidewalls 115 of the trench 103 and the hole 118 lead to substantial expansion of the trench 103 or isolation regions with respect to that of the conventional method of FIGS. 1A to 1E, which is contrary to the need to shrink the isolation regions. Moreover, the expanded trench 103 will cause a problem that current leakage is increased due to degraded isolation capability.

On the other hand, it has been known that so-called "spin coating" is effective to produce $SiO_2$ with a good trench-filling property. The spin coating process may be termed the "Spin-On-Glass (SOG)" process. When this spin coating or SOG process is used, a solution of a Si-containing material is dropped onto a main surface of a Si substrate (or, a layer located on the substrate) while rotating the substrate in a horizontal plane, thereby forming a uniformly-coated film of the solution on the entire main surface of the substrate (or, the layer located on the substrate) due to the effect of centrifugal force. Subsequently, the substrate 101 is heated to vaporize or volatilize the solvent of the solution from the coated film and to cause a chemical reaction of the Si-containing material with oxygen existing in the atmosphere, thereby forming a $SiO_2$ film on the whole main surface of the substrate 101 (or, the layer located on the substrate).

With the method using the spin coating process, since the solution of the Si-containing material is dropped onto the surface of the substrate (or, the layer located on the substrate) and coated thereon by the effect of centrifugal force, there arises an advantage of excellent trench-filling property. As the solution of the Si-containing material, a solution containing silicon hydroxide (i.e., silanol, $SiOH_4$) dispersed in an organic solvent such as alcohol is typically used.

A conventional method of forming a trench isolation structure using the above-described spin coating or SOG process is shown in FIGS. 3A and 3B.

First, in the same way as shown in the above-described conventional method of FIGS. 1A to 1E, an isolation trench 103 is formed in a Si substrate 101 with a $SiO_2$ film 105 and a $Si_3N_4$ film 106, as shown in FIG. 3A. Then, through a spin coating process using a solution containing $SiOH_4$ dispersed in an organic solvent, a film 107 of the $SiOH_4$ solution is formed on the $Si_3N_4$ film 106 to cover the whole main surface of the substrate 101. At this stage, the film 107 fills the entire trench 103 and the entire hole 118, as shown in FIG. 3A.

Subsequently, the film 107 of the $SiOH_4$ solution is subjected to a specified heat treatment, thereby converting the film 107 to a $SiO_2$ film 104 due to hydrolysis and dehydrating condensation reactions.

Finally, in the same way as shown in the above-described conventional method of FIGS. 1A to 1E, the $SiO_2$ film 104 located over the surface of the $Si_3N_4$ film 106 is selectively removed by CMP and then, the $Si_3N_4$ film 106 and the $SiO_2$ film 105 are successively removed by wet etching. As a result, the part of the $SiO_2$ film 104 located below the surface of the $Si_3N_4$ film 106 is left in the trench 103 and the hole 118, thereby forming a trench isolation structure 102 that isolates electrically two adjoining active regions A101 and A102, as shown in FIG. 33.

The conventional method using the spin coating shown in FIGS. 3A and 3B, however, has the following problem.

During the heat-treatment process for converting the Si-containing material film 107 to the $SiO_2$ film 104, a large-volume shrinkage occurs in the film 107 due to the dehydrating condensation reaction. As a result, the part of the $SiO_2$ film 104 located in the trench 103 and the hole 118 (i.e., the isolation dielectric), which has a comparatively larger thickness or height than the remaining part, is unable to resist the shrinkage action, resulting in cracks 117 in the remaining $SiO_2$ film 104, as shown in FIG. 3B.

Furthermore, it has been known that the $SiO_2$ film 104 generated by the dehydrating condensation reaction of $SiOH_4$ contains a lot of $SiOH_4$ groups as well as the film 104 is porous due to insufficient densification. These properties of she $SiO_2$ film 104 affect badly the CMP process for removing selectively the $SiO_2$ film 104 and/or the wet etching processes for removing the $Si_3N_4$ film 106 and the $SiO_2$ film 105. As a result, the top of the remaining $SiO_2$ film 104 tends to be lowered to form a depression or hollow 116 thereon in the trench 103, as shown in FIG. 3B.

In particular, when the pad $SiO_2$ film 105 is formed by thermal oxidation, the depression or hollow 116 is likely to be formed. This is due to the fact that the $SiO_2$ film 104 generated by the chemical reaction of the film 107 of the $SiOH_4$ solution is much larger in etch rate than the $SiO_2$ film 105 formed by thermal oxidation in the wet etching process for removing the $SiO_2$ film 105.

As described above, the conventional method shown in FIGS. 1A to 1E has a problem that the void 106 tends to be formed in the remaining $SiO_2$ film 113 in the isolation trench 103. The conventional method shown in FIG. 2 solves this problem relating to the void 106. However, it has a problem that the isolation region is expanded, the isolation capability is degraded, and the current leakage is increased. The conventional method shown in FIGS. 3A and 3B has a problem that the cracks 117 and/or the depression 116 tend to be formed in the remaining $SiO_2$ film 104 in the isolation trench 103.

SUMMARY OF THE INVENTION

Accordingly, an object of the present invention to provide a method of forming a trench isolation structure that prevents generation of defects such as voids, cracks, and depressions of an isolation dielectric formed in an isolation trench without problems such as isolation region expansion, isolation capability degradation, and current leakage increase.

Another object of the present invention to provide a method of forming a trench isolation structure that makes it possible to fill a fine isolation trench having a width of approximately 0.1 μm with a dielectric.

The above objects together with others not specifically mentioned will become clear to those skilled in the art from the following description.

A method of forming a trench isolation structure according to the present invention is comprised of the following first to fourth steps.

In the first step, an isolation trench is formed in a semiconductor substrate to expose a top of the trench from a main surface of the substrate.

In the second step, the whole main surface of the substrate is covered with a solution of a silazane perhydride polymer by spin coating, thereby forming a film of the solution covering the whole main surface of the substrate. The trench is entirely filled with the film of the solution.

The film of the solution may be formed directly on the main surface of the substrate or formed indirectly over the main surface of the substrate via any intervening film or films.

In the third step, the film of the solution covering the main surface of the substrate is converted to an oxide film of silicon covering the main surface of the substrate due to chemical reaction.

In the fourth step, the oxide film of silicon covering the main surface of the substrate is selectively removed, thereby leaving a part of the oxide film that is used as an isolation dielectric of a trench isolation structure in the trench.

With the method of forming a trench isolation structure according to the present invention, the film of the solution of the silazane perhydride polymer is formed to cover the whole main surface of the semiconductor substrate in the second step by using spin coating having an excellent trench-filling property. Then, the film of the solution covering the main surface of the substrate is converted to the oxide film of silicon due to chemical reaction in the third step. Thus, even if the isolation trench has a small width of approximately 0.1 $\mu$m, the oxide film of silicon can be well formed to fill the entire trench without any problems such as isolation region expansion, isolation capability degradation, and current leakage increase.

Moreover, since the film of the solution of the silazane perhydride polymer is formed by spin coating, no void is formed in the remaining part of the oxide film of silicon in the trench, i.e., in the isolation dielectric. The film of the solution of the silazane perhydride polymer scarcely shrinks during the transformation to the oxide film of silicon in the third step and therefore, no crack is formed in the isolation dielectric.

Furthermore, the oxide film of silicon generated from the film of the solution of the silazane perhydride polymer due to chemical reaction is dense and high in etch resistance. Thus, the oxide film of silicon is scarcely affected in a process (e.g., a CMP process) for removing the unused part of the oxide film of silicon in the fourth step and a process (e.g., a wet etching process) for removing other film or films (e.g, silicon nitride or silicon dioxide film) formed on the main surface of the substrate. As a result, no depression nor hollow is formed at the isolation dielectric.

As described above, with the method of forming a trench isolation structure according to the present invention, even if the isolation trench is fine to have a small width of approximately 0.1 $\mu$m, the defects of the isolation trench such as voids, cracks and depressions can be prevented from being generated without any problem such as isolation region expansion, isolation capability degradation, and current leakage increase. In other words, even if the isolation trench has a small width of approximately 0.1 $\mu$m, the isolation dielectric is well formed in the isolation trench.

In a preferred embodiment of the method according to the present invention, the third step is a heat treatment carried out in an atmosphere containing at least one selected from the group consisting of oxygen, ozone, and water vapor. This is to ensure the transformation of the silazane perhydride polymer to an oxide of silicon through the chemical reaction in the third step.

In another preferred embodiment of the method according to the present invention, the third step is carried out at a temperature of 350° C. or higher. This is to ensure the transformation of the silazane perhydride polymer to an oxide of silicon through the chemical reaction in the third step.

In still another preferred embodiment of the method according to the present invention, there is provided with a step of densifying the oxide film of silicon by heat treatment at a temperature in a range from 700° C. to 1100° C. between the third and fourth steps. If the temperature is lower than 700° C., the oxide film of silicon tends to emit some gas and/or to shrink in a subsequent process step or steps, thereby affecting badly the subsequent process step or steps. If the temperature is higher than 1100° C., there arises a possibility that the semiconductor substrate is degraded due to heat.

In a further preferred embodiment of the method according to the present invention, there is provided with a step of volatilizing a solvent contained in the film of the silazane perhydride polymer by heat treatment in an inert atmosphere between the second and third steps. In this embodiment, there is an additional advantage that the solvent contained in the film of the silazane perhydride polymer can be removed without changing its film quality.

In a still further preferred embodiment of the method according to the present invention, there is provided with a step of rounding sidewalls at the top of the isolation trench by oxidizing the main surface of the substrate between the first and second steps. In this embodiment, since the sidewalls are rounded at the top of the isolation trench, the electric field occurring in the substrate is prevented from concentrating on the corners at the top of the isolation trench. Thus, there is an additional advantage that current leakage is further suppressed to raise an obtainable withstand voltage.

In the method of forming a trench isolation structure according to the present invention, the first step may be performed by any process or processes. Any spin coating process may be applied to realize the spin coating in the second step. The solution of the silazane perhydride polymer may be readily produced by, for example, dispersing a silazane perhydride polymer in a suitable solvent (preferably, organic solvent). As the organic solvent, for example, xylene or dibutyl ether may be preferably used. Any process may be used to perform the third step if it is able to form an oxide film of silicon through chemical reaction of the film of the solution of the silazane perhydride polymer. Although a heat treatment process is typically used for this purpose, any other process may be used therefor. Any process such as a CMP process and a dry or wet etching process may be used for the fourth step.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1A:
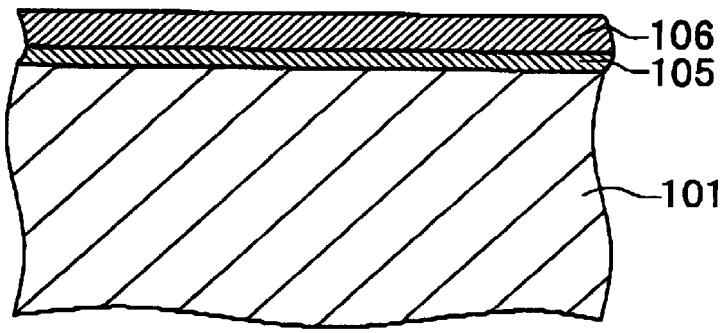
FIGS. 1A to 1E are partial cross-sectional views showing a conventional method of forming a trench isolation structure, respectively.
Figure 1B:
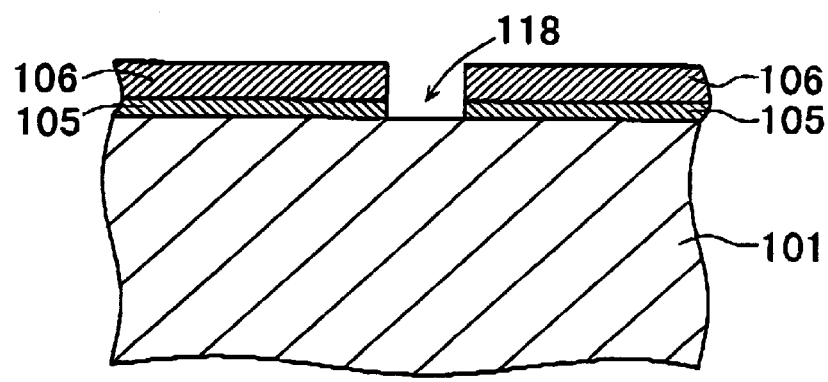
Figure 1C:
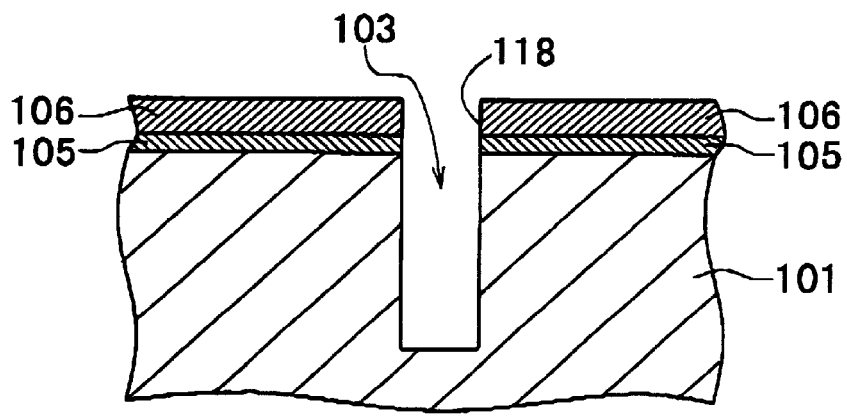
Figure 1D:
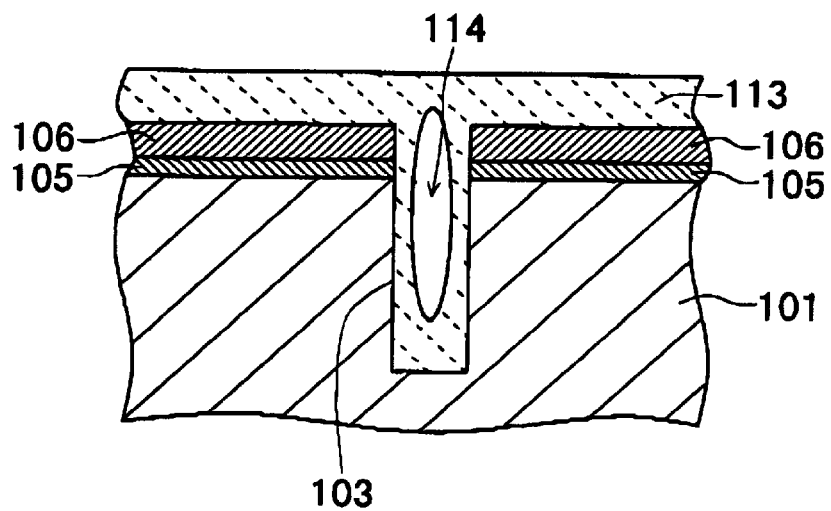
Figure 1E:
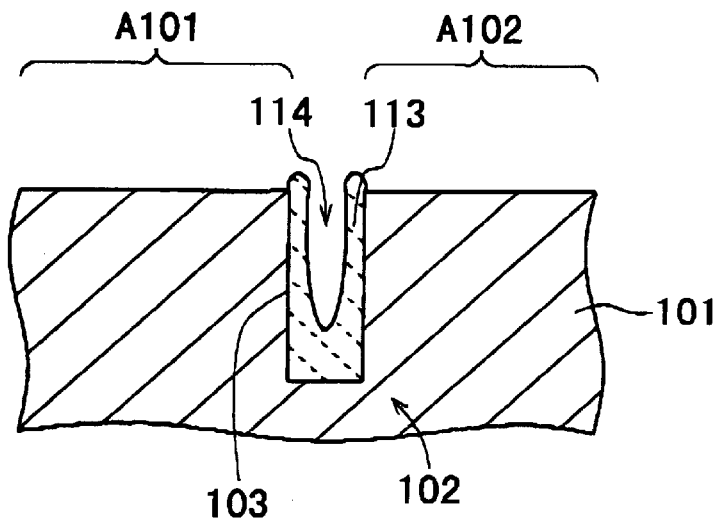
Figure 2:
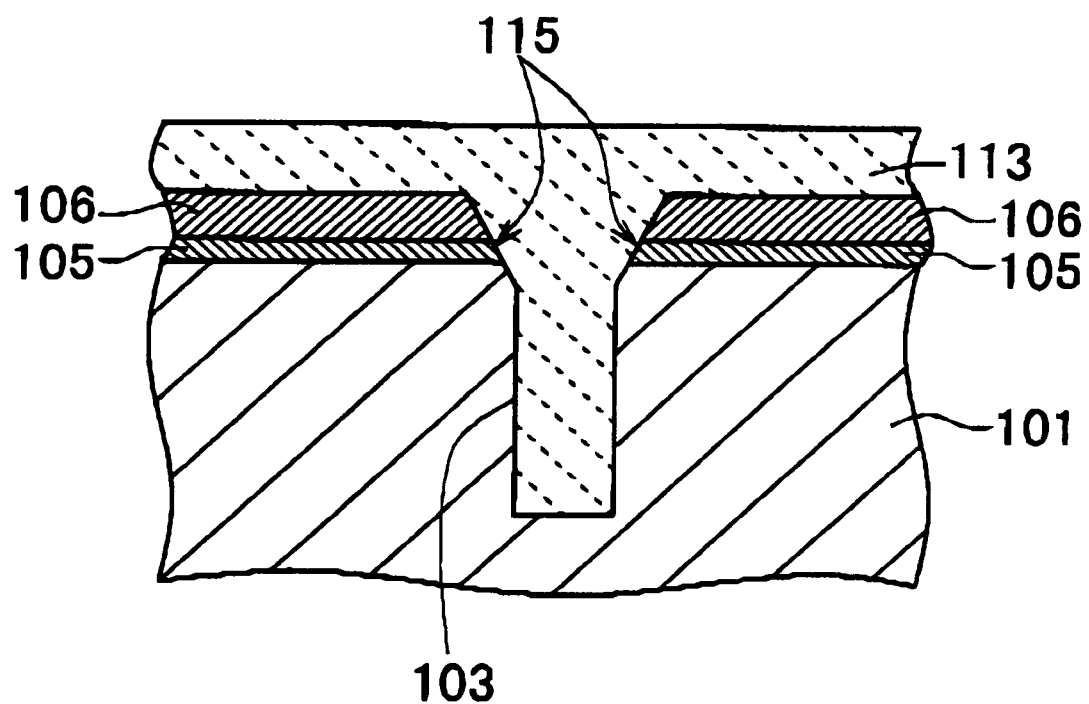
FIG. 2 is a partial cross-sectional view showing another conventional method of forming a trench isolation structure.

Preferred embodiments of the present invention will be described in detail below while referring to the drawings attached.

First Embodiment

A method of forming a trench isolation structure according to a first embodiment of the present invention is explained below with reference to FIGS. 4A to 4G.

In FIGS. 4A to 4G, although a lot of isolation trenches are practically formed in a semiconductor substrate to electrically isolate adjoining active regions from one another, only one of the trenches to isolate two adjoining active regions is illustrated and explained below for the sake of simplification.

Figure 4A:
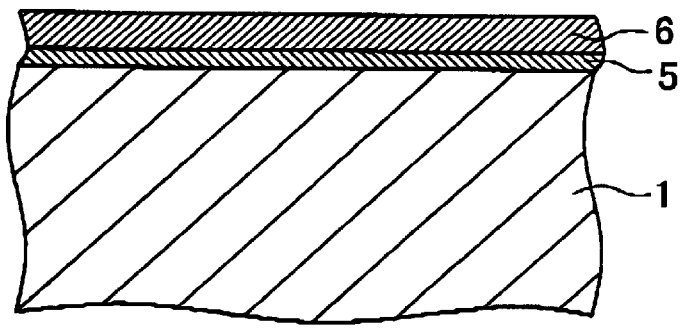
FIGS. 4A to 4G are partial cross-sectional views showing a method of forming a trench isolation structure according to a first embodiment of the present invention, respectively.

First, as shown in FIG. 4A, a $SiO_2$ film 5 with a thickness of approximately 20 nm, which serves as a pad oxide, is formed on a main surface of a single-crystal Si substrate 1 by thermal oxidation of the substrate 1. Then, a $Si_3N_4$ film 6 with a thickness of approximately 200 nm is formed on the $SiO_2$ film 5 by reduced-pressure CVD. The $Si_3N_4$ film 6 is used as a mask for an isolation trench. The state at this stage is shown in FIG. 4A.

At this stage, same $SiO_2$ and $Si_3N_4$ films as the films 5 and 6 are formed on the back surface of the substrate 1. However, they are omitted here because they have no relationship to the present invention and they are removed in subsequent processes.

Next, after a photoresist film (not shown) is formed on the $Si_3N_4$ film 6 by coating, the photoresist film is patterned by using a popular photolithography technique. The patterned photoresist film has a pattern corresponding to the plan shape of a desired isolation trench, in other words, has a window corresponding to the isolation trench to be formed.

Figure 4B:
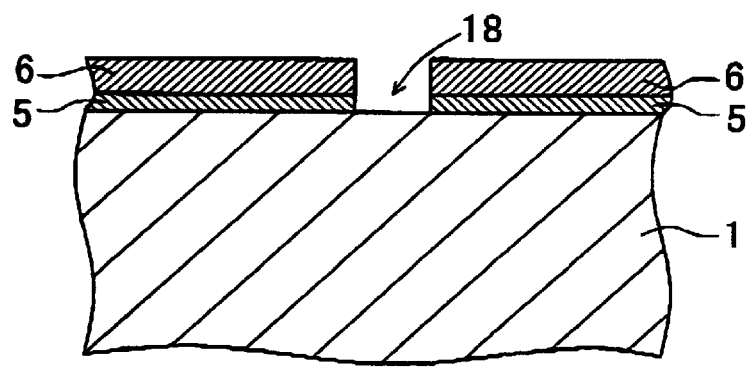

Using the patterned photoresist film as a mask, the $Si_3N_4$ film 6 and the $SiO_2$ film 5 are successively patterned by dry etching Thus, a hole 18 is formed to penetrate through the $Si_3N_4$ and $SiO_2$ films 6 and 5. The hole 18, which has a plan shape corresponding to the window of the photoresist film, is reached the main surface of the substrate 1, as shown in FIG. 4B.

Figure 4C:
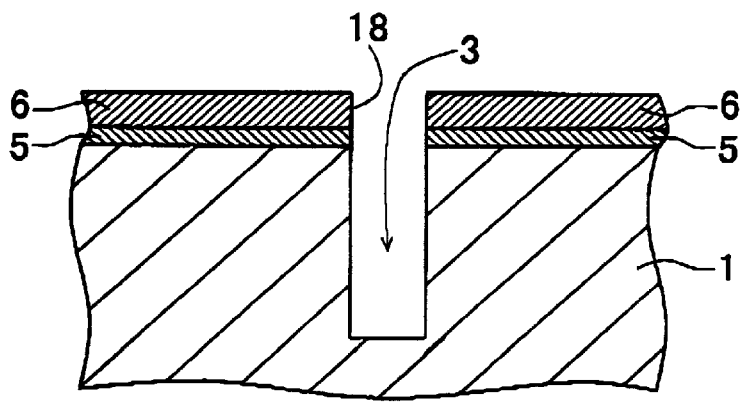

After removing the photoresist film, the substrate 1 is selectively and vertically removed through its main surface by dry etching using the $Si_3N_4$ film 6 as a mask, thereby forming vertically an isolation trench 3 in the substrate 1 to expose the top of the trench 3 from the main surface of the substrate 1, as shown in FIG. 4C. The isolation trench 3 has a plan shape corresponding to the window of the photoresist film. For example, the trench 3 has a width of 0.1 $\mu$m and a depth of 0.5 $\mu$m, resulting in an aspect ratio of 5.

The above-described process steps are the same as those in the conventional method shown in FIGS. 1A to 1E.

Figure 4D:
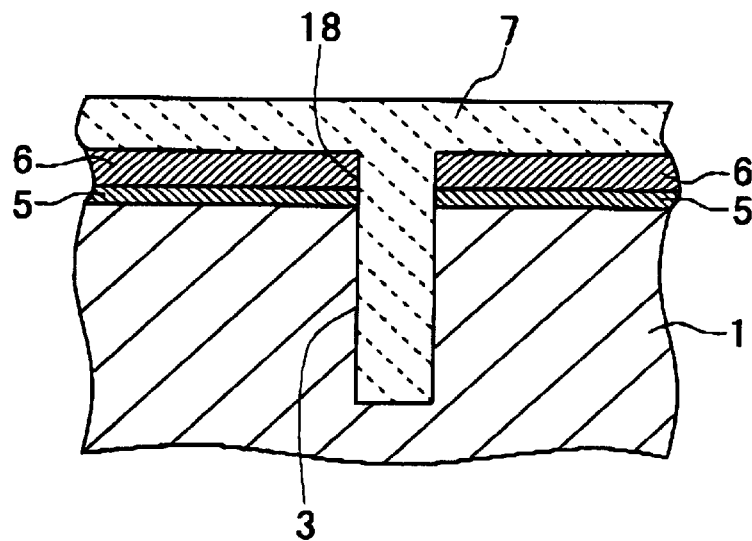

Subsequently, as shown in FIG. 4D, the whole main surface of the substrate 1 is covered with a film 7 of a solution of a silazane perhydride polymer $[(SiH_2NH)_n]$. The film 7, which is located on the $Si_3N_4$ film 6, has a thickness of approximately 400 nm. The film 7 of the solution of $[(SiH_2NH)_n]$ is formed using a spin coating process in the following way.

First, the solution of $[(SiH_2NH)_n]$ is generated by dispersing a liquid $[(SiH_2NH)_n]$ in a liquid xylene. Then, the solution of $[(SiH_2NH)_n]$ thus generated is dropped onto the surface of the $Si_3N_4$ film 6 while rotating the substrate 1 in a horizontal plane. Thus, the uniform film 7 of the solution of $[(SiH_2NH)_n]$ is formed to cover the whole main surface of the substrate 1. As a result, as shown in FIG. 4D, the trench 3 can be entirely filled with the film 7 even if the trench 3 has a narrow width of 0.1 $\mu$m and a high aspect ratio of 5. Unlike the conventional method shown in FIGS. 1A to 1E, no void is formed in the part of the film 7 located in the trench 3 and the hole 18.

A typical condition of the spin coating process is that the rotation speed of the substrate 1 is set as 4000 rpm and the rotation time is set as 20 seconds.

Figure 5:
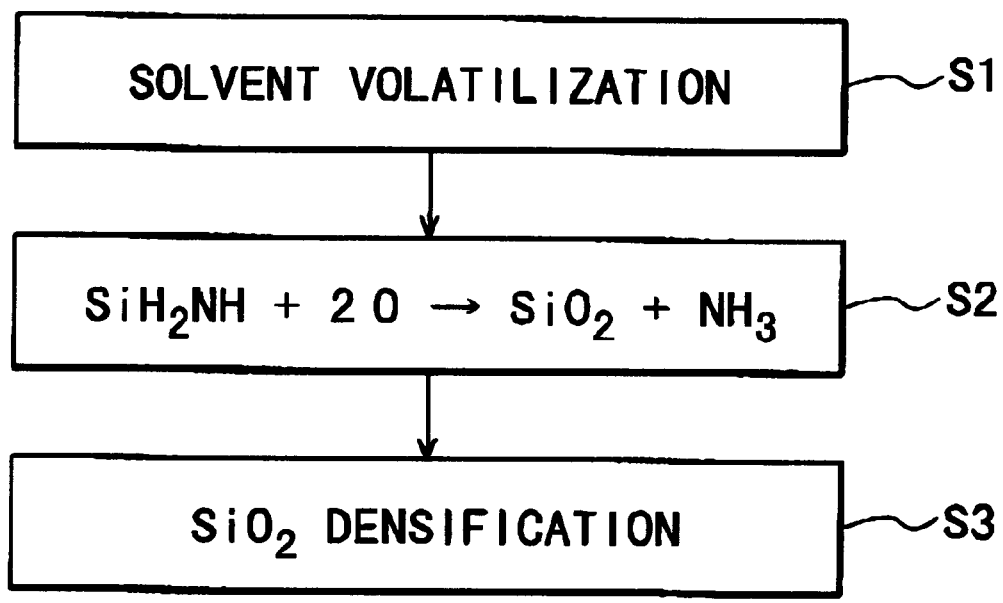
FIG. 5 is a flowchart showing the heat treatment process of the film of the silazane perhydride polymer in the method according to the first embodiment of the present invention.

Thereafter, the film 7 of the solution of $[(SiH_2NH)_n]$ on the $Si_3N_4$ film 6 is subjected to a heat treatment process, thereby converting the film 7 to a $SiO_2$ film 4. This heat treatment process contains three steps S1, S2, and S3 shown in FIG. 5.

In the step S1, the substrate 1 having the film 7 of the solution of $[(SiH_2NH)_n]$ is placed on a hot plate (not shown) in an inert atmosphere held at 200° C. for three minutes, thereby volatilizing the organic solvent (i.e., xylene) from the film 7.

In the step 52, the substrate 1 having the film 7 of the solution of $[(SiH_2NH)_n]$ is placed in a water-vapor ($H_2O$) atmosphere of an electric furnace (not shown) held at 400° C. for 60 minutes, thereby transforming the film 7 of the solution of $[(SiH_2NH)_n]$ to the $SiO_2$ film 4. The step S2 may be carried out in an oxygen ($O_2$) or ozone ($O_3$) atmosphere instead of the water vapor ($H_2O$) atmosphere.

In the step S2, the $[(SiH_2NH)_n]$ film 7 is transformed to the $SiO_2$ film 4 according to the following reaction formula (1).

$$SiH_2NH + 2O \rightarrow SiO_2 + NH_3 \qquad (1)$$

As seen from the formula (1), the silazane perhydride ($SiH_2NH$) reacts with activated oxygen (O) generated by decomposition of water vapor and as a result, silicon dioxide ($SiO_2$) and ammonia ($NH_3$) are generated. This $NH_3$ serves as a catalyst in the reaction expressed by the formula (1) and therefore, the $SiH_2NH$ contained in the film 7 are entirely converted to $SiO_2$ and the film 7 does not contain $SiH_2NH$ at all. Accordingly, the $SiO_2$ film 4 has a high density. Also, since the film 7 scarcely shrinks through the transformation or conversion to the $SiO_2$ film 4, no crack is formed in the film 4. Thus, the $SiO_2$ film 4 has an excellent etch resistance.

In the step S3, the substrate 1 having the $SiO_2$ film 4 thus obtained is placed in an inert atmosphere of the electric furnace held at 900° C. for 60 minutes, thereby removing impurities such as excessive ammonia and water from the film 7. Through this step S3, the $SiO_2$ film 4 is further densified to have a higher density.

Figure 4E:
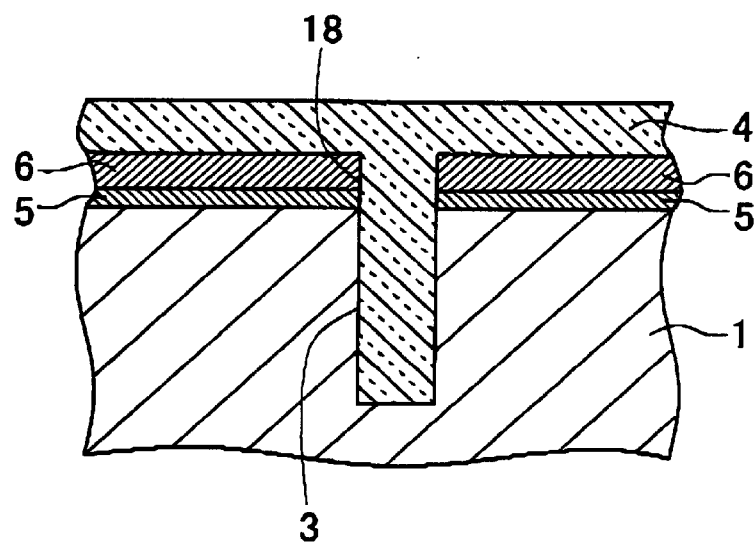

The state at this stage is shown in FIG. 4E.

Figure 4F:
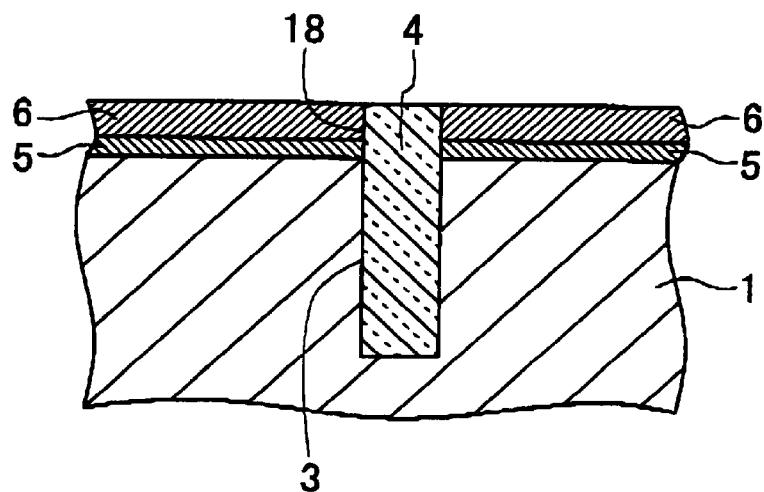

Subsequently, the $SiO_2$ film 4, which has been formed by the heat treatment of the film 7, is polished by a CMP process until the surface of the $Si_3N_4$ film 6 is exposed. Thus, as shown in FIG. 4F, only the part of the $SiO_2$ film 4 located in the trench 3 and the penetrating hole 18 is left. The top of the remaining part of the $SiO_2$ film 4 is approximately flat.

Figure 4G:
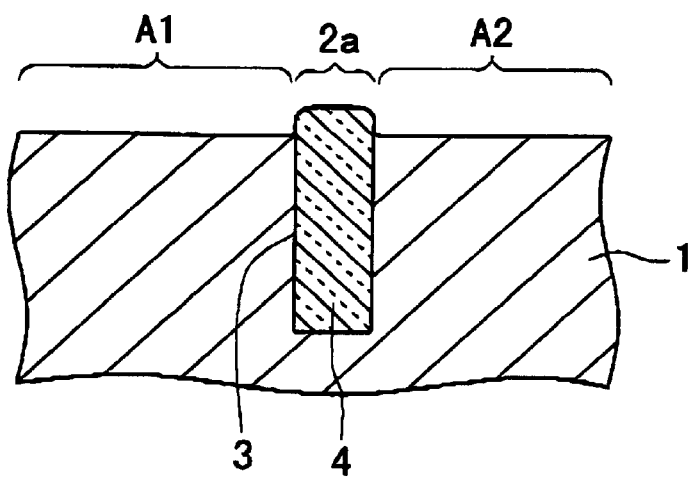

The $Si_3N_4$ film 6 is then removed by a wet etching process using a hot phosphoric acid heated to, for example, 160° C. The $SiO_2$ film 5 is then removed by a wet etching process using a buffered hydrofluoric acid. Thus, as shown in FIG. 4G, a trench isolation structure 2a is formed on the substrate 1, where the remaining $SiO_2$ film 4 in the trench 3 serves as an isolation dielectric of the structure 2a.

The remaining $SiO_2$ film 4 in the trench 3 is not etched during the etching process of the $Si_3N_4$ film 6. However, it is etched during the etching process of the $SiO_2$ film 5. Therefore, the top of the remaining $SiO_2$ film 4 (i.e., the isolation dielectric) protrudes slightly from the main surface of the substrate 1, as shown in FIG. 4G. The trench isolation structure 2a formed through the above-described method according to the first embodiment is practically used in this state.

With the method according to the first embodiment, as described above, the film 7 of the solution of the silazane perhydride polymer is formed on the $Si_3N_4$ film 6 to cover the whole main surface of the semiconductor substrate 1 by using a spin coating process having an excellent trench-filling property. Then, the film 7 of the solution covering the main surface of the substrate 1 is converted to the $SiO_2$ film 4 due to chemical reaction. Thus, even if the isolation trench 3 has a small width of approximately 0.1 $\mu$m, the $SiO_2$ film 4 can be well formed to fill the entire trench 3 without any problems such as isolation region expansion, isolation capability degradation, and current leakage increase.

Moreover, since the film 7 is formed by the spin coating process, no void is formed in the remaining part of the $SiO_2$ film 4 in the trench 3, i.e., in the isolation dielectric. The film 7 scarcely shrinks during the transformation to the $SiO_2$ film 4 and therefore, no crack is formed in the isolation dielectric 4.

Furthermore, the $SiO_2$ film 4 generated from the film 7 of the solution of the silazane perhydride polymer due to chemical reaction is dense and high in etch resistance. Thus, the $SiO_2$ film 4 is scarcely affected in the CMP process for removing the unused part of the $SiO_2$ film 4 and the wet etching processes for removing the $Si_3N_4$ and $SiO_2$ films 6 and 5. As a result, no depression or hollow is formed at the isolation dielectric 4.

Thus, even if the isolation trench 3 is fine to have a small width of approximately 0.1 $\mu$m, the isolation dielectric 4 is well formed in the trench 3.

Confirmation Test

To confirm the advantages of the present invention, the inventor performed a test under the different conditions (i), (ii), and (iii) listed below.

(i) A trench isolation structure was formed using a silazane perhydride polymer according to the above-described first embodiment.

Figure 3A:
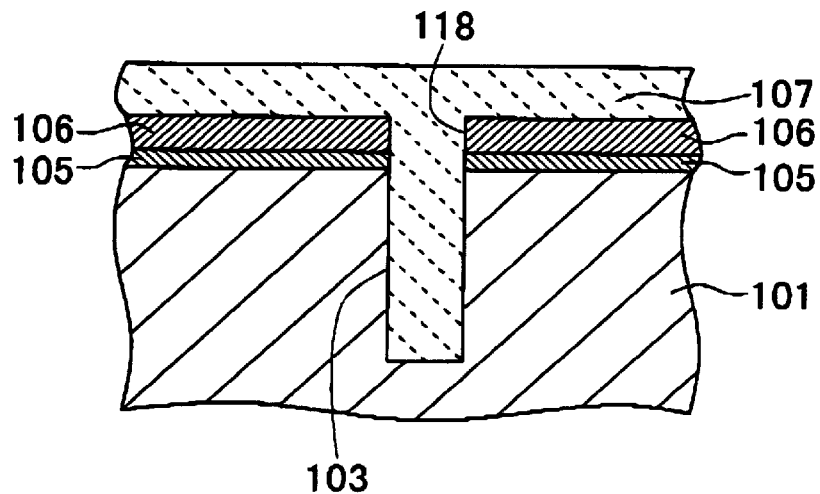
FIGS. 3A and 3B are partial cross-sectional views showing still another conventional method of forming a trench isolation structure, respectively.
Figure 3B:
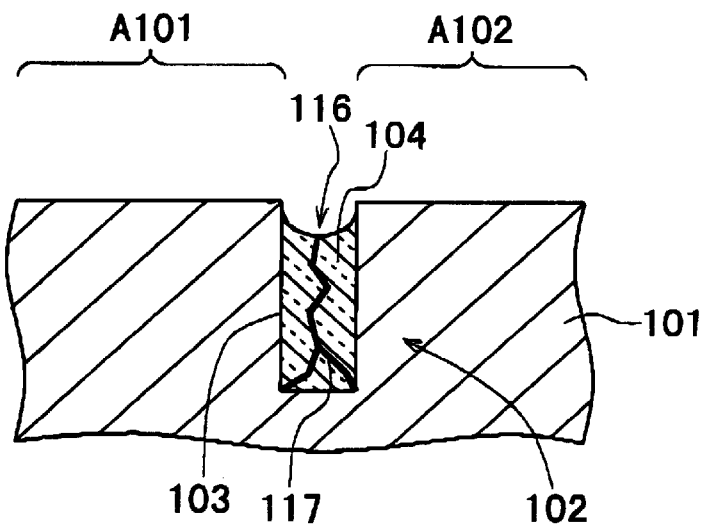

(ii) A trench isolation structure was formed using silanol according to the previously-described conventional method shown in FIGS. 3A and 3B.

(iii) A trench isolation structure was formed using a high-density plasma CVD according to the previously-described conventional method shown in FIGS. 1A to 1E.

Then, the shrinkage rate and the wet etch rate of the $SiO_2$ films formed by the methods under the conditions (i), (ii), and (iii) were measured and compared. The result of the test is shown in Table 1.

The shrinkage rate was calculated based on the measurement result of thickness change (i.e., a ratio of the difference between the resultant value and the initial value to the initial value) of the $SiO_2$ films through a heat treatment carried out in a nitrogen ($N_2$) atmosphere at 900° C. for 60 minutes.

The wet etch rate was calculated in the following way. Specifically, the $SiO_2$ films formed by the methods under the conditions (i), (ii), and (iii) and a $SiO_2$ film formed by thermal oxidation in a water vapor ($H_2O$) atmosphere at 950° C. were etched using a buffered hydrofluoric acid, and etch rates of these $SiO_2$ films were measured. The buffered hydrofluoric acid was made by mixing hydrofluoric acid (HF) with ammonium fluoride ($NH_4F$) at a ratio of 1:30. Then, the ratio of the etch rates of the $SiO_2$ films formed by the methods under the conditions (i), (ii), and (iii) with respect to that of the $SiO_2$ film formed by thermal oxidation was calculated.

TABLE 1

| $SiO_2$ DEPOSITION PROCESS | SHRINKAGE RATE (%) | WET ETCH RATE (times) |
| --- | --- | --- |
| SILAZANE PERHYDRIDE POLYMER $(SiH_2NH)_n$ | 3 | 1.5 |
| SILANOL $(SiOH_4)$ | 30 | 10.0 |
| HIGH-DENSITY PLASMA CVD | 3 | 1.5 |

The following is clearly seen from Table 1.

In the case of the $SiO_2$ film under the condition (ii) using $SiOH_4$, the shrinkage rate has a large value of 30%. On the other hand, in the cases of the $SiO_2$ films under the conditions (i) and (iii) using $(SiH_2NH)_n$ and high-density plasma CVD, the shrinkage rates have a very small value of 3%. As a result, it was confirmed that the shrinkage rate of the $SiO_2$ film formed by the method according to the first embodiment under the conditions (i) was as low as that formed using high-density plasma CVD under the conditions (iii).

In the case of the $SiO_2$ film under the condition (i) using $(SiH_2NH)_n$, the wet etch rate has a very small value of 1.5, which is much lower than the value of 10.0 in the case under the condition (ii) using $SiOH_4$. As a result, it was confirmed that the wet etch rate of the $SiO_2$ film formed by the method according to the first embodiment under the condition (i) was as low as that formed using high-density plasma CVD. In other words, it was confirmed that the density of the $SiO_2$ film formed by the method according to the first embodiment was as high as that formed using high-density plasma CVD.

Second Embodiment

FIGS. 6A to 6E show a method of a trench isolation structure according to a second embodiment of the present invention.

Figure 6A:
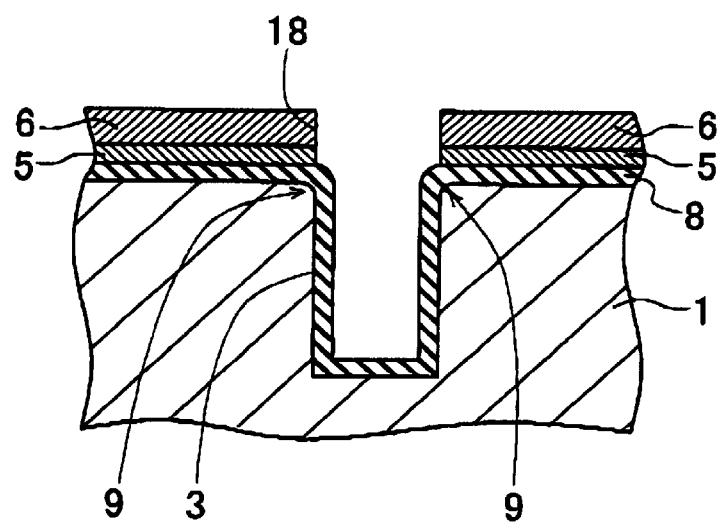
FIGS. 6A to 6E are partial cross-sectional views showing a method of forming a trench isolation structure according to a second embodiment of the present invention, respectively.

First, in the same way as that of the first embodiment, an isolation trench 3 is formed in a single-crystal Si substrate 1. Thereafter, the substrate 1 is subjected to a thermal oxidation process, thereby forming a $SiO_2$ film B covering the main surface of the substrate 1 and the sidewalls and bottom wall of the trench 3, as shown in FIG. 6A. Through this thermal oxidation process, the top corners 9 of the trench 3 are rounded.

Subsequent processes are substantially the same as those in the first embodiment.

Specifically, a pad $SiO_2$ film 5 with a thickness of approximately 20 nm is formed on the $SiO_2$ film 8 by thermal oxidation of the substrate 1. Then, a $Si_3N_4$ film 6 with a thickness of approximately 200 nm is formed on the $SiO_2$ film 5 by reduced-pressure CVD.

Next, using a patterned photoresist film (not shown) as a mask, the $Si_3N_4$ film 6 and the $SiO_2$ film 5 are successively patterned by dry etching, thereby forming a hole 18 penetrating through the $Si_3N_4$ and $SiO_2$ films 6 and 5 to overlap with the trench 3. The state at this stage is shown in FIG. 6A.

Figure 6B:
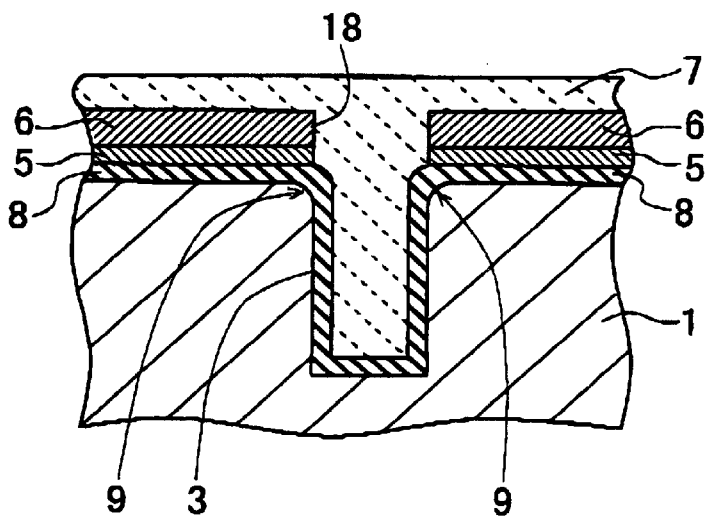

After removing the photoresist film, as shown in FIG. 6B, a film 7 of a solution of a silazane perhydride polymer $[(SiH_2NH)_n]$ is formed on the $Si_3N_4$ film 6 to cover the whole main surface of the substrate 1. The film 7 has a thickness of approximately 400 nm. The film 7 of the solution of $[(SiH_2NH)_n]$ is formed using a spin coating process in the same way as described in the first embodiment. As a result, as shown in FIG. 6B, the trench 3 and the hole 18 can be entirely filled with the film 7 even if the trench 3 has a narrow width of 0.1 μm and a high aspect ratio of 5. Unlike the conventional method shown in FIGS. 1A to 1E, no void is formed in the part of the film 7 located in the trench 3.

Figure 6C:
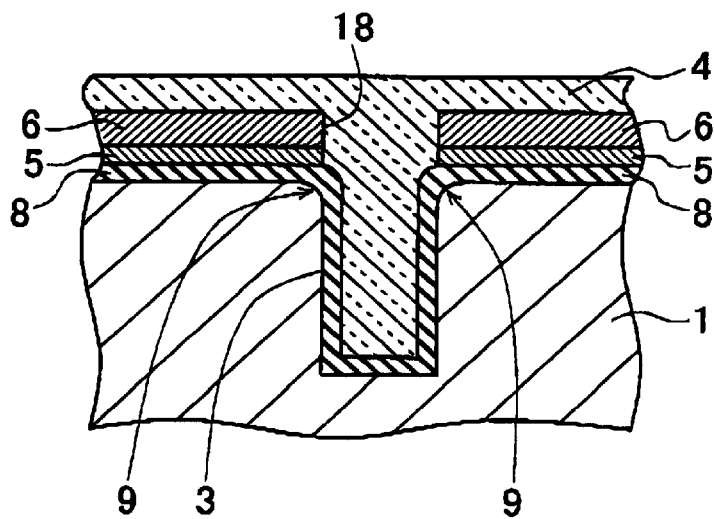
Figure 6D:
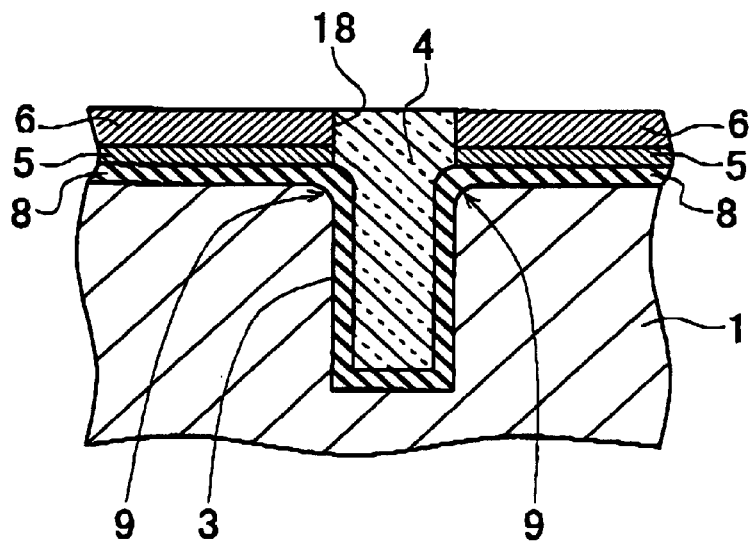

Thereafter, the film 7 of the solution of $[(SiH_2NH)_n]$ on the $Si_3N_4$ film 6 is subjected to a same heat treatment process as in the first embodiment, thereby converting the film 7 to a $SiO_2$ film 4, as shown in FIG. 6C. Subsequently, the $SiO_2$ film 4 is polished by a CMP process until the surface of the $Si_3N_4$ film 6 is exposed. Thus, as shown in FIG. 6D, only the part of the $SiO_2$ film 4 located in the trench 3 and the penetrating hole 18 is left. The top of the remaining part of the $SiO_2$ film 4 is approximately flat.

Figure 6E:
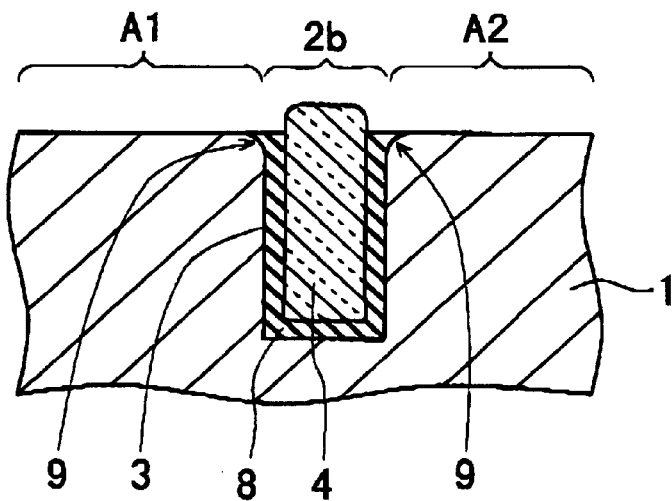

The $Si_3N_4$ film 6 is then removed by wet etching. The entire $SiO_2$ film 5 and the part of the $SiO_2$ film 8 located on the main surface of the substrate 1 are removed by wet etching. Thus, as shown in FIG. 6E, a trench isolation structure 2b is formed on the substrate 1, where the remaining $SiO_2$ films 4 and 8 serve as an isolation dielectric.

The remaining $SiO_2$ film 4 in the trench 3 and the hole 18 is not etched during the etching process of the $Si_3N_4$ film 6 and is etched during the etching process of the $SiO_2$ films 5 and 8. Therefore, the top of the remaining $SiO_2$ film 4 (i.e., the isolation dielectric) protrudes slightly from the main surface of the substrate 1, as shown in FIG. 6E. The trench isolation structure 2b formed through the above-described processes is practically used in this state.

As described above, the method of forming the trench isolation structure 2b according to the second embodiment includes the same process steps as those in the first embodiment, it has the same advantages as those in the first embodiment. Moreover, the top corners 9 of the trench 3 are rounded and the isolation dielectric is formed by the remaining $SiO_2$ films 4 and 8. Thus, the electric field occurring in the substrate 1 is prevented from concentrating on the corners 9, which suppresses current leakage more effectively than the first embodiment. As a result, there is an additional advantage that an obtainable withstand voltage is higher than the first embodiment.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A method of forming a trench isolation structure, comprising:

a first step of forming an isolation trench in a semiconductor substrate to expose a top of the trench from a main surface of the substrate;

a second step of covering said whole main surface of said substrate with a solution of a silazane perhydride polymer by spin coating, thereby forming a film of said solution covering said whole main surface of said substrate;

said trench being entirely filled with said film of said solution;

a third step of converting said film of said solution covering said main surface of said substrate to an oxide film of silicon covering said main surface of said substrate due to chemical reaction; and a fourth step of selectively removing said oxide film of silicon covering said main surface of said substrate, thereby leaving a part of said oxide film that is used as an isolation dielectric of a trench isolation structure in said trench.

2. The method as claimed in claim 1, wherein said third step is a heat treatment carried out in an atmosphere containing at least one selected from the group consisting of oxygen, ozone, and water vapor.

3. The method as claimed in claim 1, wherein said third step is carried out at a temperature of 350° C. or higher.

4. The method as claimed in claim 1, further comprising a step of densifying said oxide film of silicon by heat treatment at a temperature in a range from 700° C. to 1100° C. between said third and fourth steps.

5. The method as claimed in claim 1, further comprising a step volatilizing a solvent contained in said film of said silazane perhydride polymer by heat treatment in an inert atmosphere between said second and third steps.

6. The method as claimed in claim 1, further comprising a step of rounding sidewalls at the top of said isolation trench between said first and second steps.

7. The method as claimed in claim 6, wherein said step of rounding sidewalls at the top of said isolation trench is performed by oxidizing said main surface of said substrate.

* * * * *